US011682541B2

United States Patent
Ni et al.

(10) Patent No.: US 11,682,541 B2
(45) Date of Patent: Jun. 20, 2023

(54) RADIO FREQUENCY POWER SUPPLY SYSTEM, PLASMA PROCESSOR, AND FREQUENCY-TUNING MATCHING

(71) Applicant: ADVANCED MICRO-FABRICATION EQUIPMENT INC. CHINA, Shanghai (CN)

(72) Inventors: Tuqiang Ni, Shanghai (CN); Lei Xu, Shanghai (CN); Leyi Tu, Shanghai (CN)

(73) Assignee: ADVANCED MICRO-FABRICATION EQUIPMENT INC. CHINA, Shanghai (CN)

( * ) Notice: Subject to any disclaimer, the term of this patent is extended or adjusted under 35 U.S.C. 154(b) by 287 days.

(21) Appl. No.: 16/998,205

(22) Filed: Aug. 20, 2020

(65) Prior Publication Data

US 2021/0057188 A1 Feb. 25, 2021

(30) Foreign Application Priority Data

Aug. 22, 2019 (CN) .......................... 201910779524.8

(51) Int. Cl.
 *H01J 37/32* (2006.01)
 *H03H 7/40* (2006.01)
 *H03H 7/38* (2006.01)

(52) U.S. Cl.
 CPC ......... *H01J 37/32183* (2013.01); *H03H 7/40* (2013.01); *H03H 2007/386* (2013.01)

(58) Field of Classification Search
 CPC ........... H01J 37/32183; H01J 37/32091; H01J 37/32155; H01J 2237/332;

(Continued)

(56) References Cited

U.S. PATENT DOCUMENTS 6,774,570 B2 8/2004 Tsuchiya et al.
9,275,870 B2 3/2016 Xu et al.
(Continued)

FOREIGN PATENT DOCUMENTS

CN 102479657 A 5/2012
CN 103730316 A 4/2014
(Continued)

*Primary Examiner* — Renan Luque
(74) *Attorney, Agent, or Firm* — Womble Bond Dickinson (US) LLP; Joseph Bach, Esq.

(57) ABSTRACT

Disclosed are a radio-frequency power supply system, a plasma processor, and a corresponding frequency-tuning matching method applied to a plasma processor having an ultra-low frequency bias radio-frequency power source. The frequency-tuning matching method comprises an impedance segment frequency matching obtaining step including partitioning a low frequency radio-frequency power output period into a plurality of impedance matching segments, and during each impedance matching segment, tuning output frequency of a high frequency radio-frequency source, detecting reflected power of the high frequency radio-frequency power supply, and after experiencing one or more low frequency radio-frequency power output period, obtaining and storing the segment matching frequency for each impedance matching segment. In the subsequent variable-frequency matching step, output frequency of the high frequency radio-frequency power supply is set to periodically vary in the stored plurality of segment matching frequencies so as to match characteristic impedance in respective impedance matching segment.

28 Claims, 6 Drawing Sheets

(58) Field of Classification Search
CPC ............... H01J 2237/334; H03H 7/40; H03H 2007/386; H01L 21/67011; H01L 21/67069
See application file for complete search history.

(56) References Cited

U.S. PATENT DOCUMENTS

| | | |
|---|---|---|
| 9,754,767 B2 | 9/2017 | Kawasaki |
| 2009/0295296 A1 | 12/2009 | Shannon et al. |
| 2015/0206717 A1 | 7/2015 | Valcore, Jr. et al. |
| 2018/0047543 A1 | 2/2018 | Setton et al. |
| 2018/0082821 A1* | 3/2018 | Ikeda ................ H01J 37/32183 |
| 2020/0185196 A1* | 6/2020 | Ye .................... H01J 37/32183 |
| 2020/0381214 A1* | 12/2020 | Leray ................. H01L 21/3065 |
| 2021/0050185 A1* | 2/2021 | Martinez ........... H01J 37/32155 |

FOREIGN PATENT DOCUMENTS

| | | |
|---|---|---|
| CN | 107316794 A | 11/2017 |
| CN | 107731647 A | 2/2018 |
| CN | 108028166 A | 5/2018 |
| CN | 109994360 A | 7/2019 |
| TW | 200303706 A | 9/2003 |
| TW | 201417138 A | 5/2014 |

\* cited by examiner

RADIO FREQUENCY POWER SUPPLY SYSTEM, PLASMA PROCESSOR, AND FREQUENCY-TUNING MATCHING

RELATED APPLICATION

The present application claims priority to and the benefit of Chinese Patent Application No. 201910779524.8, filed on Aug. 22, 2019, and the disclosure of which is hereby incorporated by reference in its entirety.

FIELD

Embodiments of the present disclosure relate to semiconductor processing equipment, and more particularly relate to a frequency-tuning matching method for a plasma processor.

BACKGROUND

Vacuum processing apparatuses are widely applied in the semiconductor industry, among which plasma processing apparatuses and chemical vapor deposition apparatuses are heavily used. The plasma processing apparatus generates plasma by radio-frequency (RF) coupled discharge, and then performs processing such as deposition and etching with the plasma.

FIG. 1 shows a capacitive coupling plasma processing apparatus, comprising a reaction chamber 100, in the reaction chamber being provided an electrically conductive base 22 that serves as a lower electrode connected to a source radio-frequency power supply 32 and a bias radio-frequency power supply 31, wherein the source radio-frequency power supply 32 outputs, via a matcher 2, a high frequency radio-frequency (HF) power to the base 22, and the bias radio-frequency power supply 31 outputs, via a matcher 1, a low frequency radio-frequency (LF) power to the base 22, wherein the high frequency radio-frequency frequency power outputted by the source radio-frequency power supply 32 is configured to ignite and maintain plasma in the reaction chamber, and the low frequency radio-frequency frequency power outputted by the bias radio-frequency power supply 31 is configured to control the bias voltage ($V_{dc}$) on a substrate 20. To facilitate understanding, the source radio-frequency power supply is hereinafter referred to as a high frequency radio-frequency power supply, and the bias radio-frequency power supply is referred to as a low frequency radio-frequency power supply. The to-be-processed substrate 20 is fixed onto an electrostatic chuck 21 on the base 22, and a focus ring 21 is further provided surrounding the substrate and the electrostatic chuck. A disc-shaped gas showerhead 11 is disposed above the reaction chamber opposite to the electrostatic chuck, the gas showerhead 11 being connected to an external reactant gas source 110 via a gas supply pipeline. FIG. 2 shows the plasma voltage $V_p$ in the reaction chamber, the surface voltage $V_w$ on the wafer, and the average voltage $V_{dc}$ for accelerating the ions after the plasma is ignited, wherein the frequency of the high frequency radio-frequency power is 60 MHz, the frequency of the low frequency radio-frequency power is 2 MHz, and the corresponding period lengths are P1, P2, respectively. It may be seen that the high radio-frequency frequency voltage is superimposed on the low radio-frequency frequency voltage, which are jointly fed into the reaction chamber. During operating of the plasma processor, the impedance of the plasma will vary drastically before and after ignition, or upon change of such parameters as input radio-frequency power and gas pressure; therefore, active tunable elements in the matchers 1, 2 are adapted to compensate for such impedance variations, such that the radio-frequency powers outputted by the source radio-frequency power supply 32 and the bias radio-frequency power supply 31 can be effectively transmitted into the reaction chamber without being reflected back to the respective radio-frequency power supplies; an impedance matching state refers to a state when the reflected power is the minimized. The impedance of the matcher is adjusted by mechanical movements of movable components inside the matchers; this matching method is acceptable for the applications where the plasma impedance changes slowly; however, for the applications where the plasma impedance changes fast within a very short time, e.g., within 1 ms, the mechanically-driven variable capacitors in traditional matchers cannot respond in such short time and thus cannot realize effective impedance matching. Once the effective matching fails, the power is considerably wasted in the feed forward and reflection circuits; besides, a considerable amount of extra reflective current will flow into the radio-frequency power supplies, which will cause over heating of the radio-frequency power supplies, thereby affecting the service life of the electronic components inside, resulting in frequent replacement of expensive radio-frequency power supplies, and significantly increasing use cost of the plasma processor.

Therefore, the present disclosure provides a novel radio-frequency matching method or apparatus to match such impedance which varies drastically within a short time so as to effectively supply the radio-frequency power into the plasma processor.

SUMMARY

In view of the above, the present disclosure provides a plasma processor, comprising: a reaction chamber, in the reaction chamber being provided a base, the base being used to hold a wafer; a source radio-frequency power supply, configured for applying a first radio-frequency periodic signal into the reaction chamber so as to ignite and maintain plasma, the source radio-frequency power supply being a frequency-tuning power supply, the frequency of the first radio-frequency periodic signal being tunable within a preset range; a bias radio-frequency power supply, configured for applying a second radio-frequency periodic signal to the base, each cycle of the second radio-frequency periodic signal including a plurality of impedance matching segments, output voltage of the bias radio-frequency power supply varying between the plurality of impedance matching segments; and a controller configured for controlling the source radio-frequency power supply to selectively output a segment matching frequency during each impedance matching segment so as to guarantee that radio-frequency power outputted by the source radio-frequency power supply can be effectively applied into the reaction chamber to thereby reduce reflected power.

Alternatively, the controller comprises a storage unit that stores segment matching frequencies in one-to-one correspondence with the plurality of impedance matching segments; during one of the impedance matching segments, the controller controlling the source radio-frequency power supply to output the matching frequency corresponding to the impedance matching segment.

Alternatively, the controller performs frequency tuning for the source radio-frequency power supply at least once during each impedance matching segment to obtain a segment matching frequency, and stores the segment matching frequency and its corresponding impedance matching segment in the storage unit.

Alternatively, a segment matching frequency learning program is provided in the controller, the segment matching frequency learning program including: tuning output frequency of the first radio-frequency periodic signal at least once during each impedance matching segment, detecting a reflected power value or plasma processor impedance value which corresponds to each output frequency, wherein when the reflected power value or plasma processor impedance value is lower than a predetermined threshold, the output frequency is determined as the segment matching frequency for the impedance matching segment.

Alternatively, the controller has a database that stores bias radio-frequency power supply output voltages and corresponding matching frequencies, and the controller performs the segment matching frequency learning program to obtain a learned segment matching frequency corresponding to the impedance matching segment, and then calculates based on the segment matching frequency as obtained and the database to obtain the remaining plurality of segment matching frequencies.

Alternatively, the controller comprises a computing unit that calculates based on input processing parameters to obtain a plurality of segment matching frequencies matched with the processing parameters, and the controller controls the source radio-frequency power supply to output a matched segment matching frequency during each impedance matching segment.

Alternatively, the frequency of the first radio-frequency periodic signal is greater than 10 MHz, and the frequency of the second radio-frequency periodic signal is lower than 1 MHz.

Alternatively, the frequency of the second radio-frequency periodic signal is lower than 500 KHz.

Alternatively, the second radio-frequency period includes at least 3 impedance matching segments, output voltage of the bias radio-frequency power supply varies alternately and periodically between the highest voltage and the lowest voltage, the average voltages during the first through the $N^{th}$ impedance matching segments are sequentially arranged from low to high, and the plurality of segment matching frequencies are respectively matched with the impedances of the plasma during the first through the $N^{th}$ impedance matching segments.

Alternatively, response time for the source radio-frequency power supply to perform frequency tuning is set to be greater than or equal to period length of the second radio-frequency periodic signal, a first segment matching frequency corresponding to the first impedance matching segment is learned during the first impedance matching segment across multiple second RF periods, and a second segment matching frequency corresponding to a second impedance matching segment is learned during the second impedance matching segment across the subsequent plurality of second RF periods.

Alternatively, the response time for the source radio-frequency power supply to perform frequency tuning is shorter than the period length of the second radio-frequency periodic signal, the source radio-frequency power supply performs frequency matching during the first impedance matching segment of one second RF period, and performs frequency matching during the first and second impedance matching segment of one second RF period.

Alternatively, the output power of the source radio-frequency power supply is pulsed and varies alternately between the high power level and the low power level, wherein the pulse frequency spans from 100 KHz to 10 KHz.

Alternatively, when the output power of the source radio-frequency power supply is in a high power level, the segment matching frequency learning program is performed once to obtain and store segment matching frequencies corresponding to the high power level; and when the output power of the source radio-frequency power supply is in a low power level, the segment matching frequency learning program is performed once again to obtain and store the segment matching frequencies corresponding to the low power level.

Alternatively, the frequency of the first radio-frequency periodic signal is f0, and the frequency variable range of the first radio-frequency periodic signal is f0±5%.

Alternatively, the controller further comprises a determining module that determines the currently located impedance matching segment based on the second radio-frequency periodic signal and controls the source radio-frequency power supply to selectively output the segment matching frequency for the impedance matching segment.

The present disclosure further comprises a frequency-tuning matching method for a plasma processor, comprising:

providing a source radio-frequency power supply that outputs a first radio-frequency periodic signal into the plasma processor so as to ignite and maintain the plasma, the source radio-frequency power supply being a frequency-tuning power supply, the frequency of the first radio-frequency periodic signal being tunable within a preset range;

providing a bias radio-frequency power supply that outputs a second radio-frequency periodic signal to a base in the plasma processor, wherein each cycle of the second radio-frequency periodic signal includes a plurality of impedance matching segments, wherein the average output voltage of the bias radio-frequency power supply varies between the plurality of impedance matching segments; and providing a controller that controls the source radio-frequency power supply to output a segment matching frequency at each impedance matching segment such that the radio-frequency power outputted by the source radio-frequency power supply can be effectively applied into the plasma processor to thereby reduce reflected power.

Alternatively, the method further comprises a segment matching frequency learning step, the segment matching learning step including: tuning output frequency of the first radio-frequency periodic signal at least once during each impedance matching segment of the second RF period, and detecting a reflected power value or plasma processor impedance value which corresponds to each output frequency, wherein when the reflected power value or plasma processor impedance value is lower than a predetermined threshold, the output frequency is determined as the segment matching frequency of the impedance matching segment.

Alternatively, the controller has a database that stores bias radio-frequency power supply output voltages and corresponding matching frequencies, performs the segment matching frequency learning step at least once to obtain a segment matching frequency corresponding to at least one impedance matching segment, and then calculates based on the segment matching frequency obtained and the database to obtain the other segment matching frequencies.

Alternatively, the controller calculates based on inputted processing parameters to obtain a plurality of segment matching frequencies matched with the processing parameters, and the controller controls the source radio-frequency power supply to output a matched segment matching frequency during each impedance matching segment.

Alternatively, a storage unit is provided in the controller, and the segment matching frequencies and the corresponding impedance matching segments are stored in the storage unit.

Alternatively, a determining module is provided in the controller, wherein the determining module is configured to determine the currently located impedance matching segment based on the second radio-frequency periodic signal, and the controller controls the source radio-frequency power supply to selectively output the segment matching frequency corresponding to the determined impedance matching segment.

Alternatively, in the plasma processing process, the reflected power value or plasma processor impedance value corresponding to the output frequency of the source radio-frequency power supply is continuously monitored, and when the reflected power value or plasma processor impedance value is greater than a preset threshold, the matching frequency learning step is performed once again.

Alternatively, each second radio-frequency periodic signal cycle includes more than 3 impedance matching segments, the output voltage of the bias radio-frequency power supply is set to vary alternately and periodically between the lowest voltage and the highest voltage, the average voltages during the first through the $N^{th}$ impedance matching segments are sequentially arranged from low to high, and the plurality of segment matching frequencies are respectively matched with the impedances of the plasma during the first through the $N^{th}$ impedance matching segments.

Alternatively, response time for the source radio-frequency power supply to perform frequency tuning is set to be greater than or equal to the period length of the second radio-frequency periodic signal, and the source radio-frequency power supply obtains, in first impedance matching segments of the plurality of second RF periods, first segment matching frequencies corresponding to the first impedance matching segments, and obtains, in a subsequent plurality of second RF periods, second segment matching frequencies corresponding to second impedance matching segments.

Alternatively, response time for the source radio-frequency power supply to perform frequency tuning is shorter than period length of the second radio-frequency periodic signal, and the source radio-frequency power supply performs frequency matching at least once in the first impedance matching segment of one second RF period, and performs frequency matching at least once in the second impedance matching segment of the same second radio-frequency periodic signal.

Alternatively, output power of the source radio-frequency power supply is set to be pulsed; and the source radio-frequency power supply varies alternately between the high power level and the low power level, wherein the pulse frequency ranges from 100 KHz to 10 KHz.

Alternatively, when the output power of the source radio-frequency power supply is in a high power level, the segment matching frequency learning program is performed once to obtain and store segment matching frequencies corresponding to the high power level; and when the output power of the source radio-frequency power supply is in a low power level, the segment matching frequency learning program is performed once again to obtain and store the segment matching frequencies corresponding to the low power level.

The present disclosure further comprises a radio-frequency power supply system, comprising:

a source radio-frequency power supply, configured for outputting a first radio-frequency periodic signal, the source radio-frequency power supply being a frequency-tuning power supply, the frequency of the first radio-frequency periodic signal being tunable within a preset range;

a bias radio-frequency power supply, configured for outputting a second radio-frequency periodic signal, each cycle of the second radio-frequency periodic signal including a plurality of impedance matching segments, output voltage of the bias radio-frequency power supply varying between the plurality of impedance matching segments; and a controller, configured for controlling the source radio-frequency power supply to output a segment matching frequency during each impedance matching segment.

Alternatively, the controller comprises a storage unit that stores segment matching frequencies in one-to-one correspondence with the plurality of impedance matching segments, the controller controlling the source radio-frequency power supply to output the RF power at the segment matching frequency during a corresponding impedance matching segment.

Alternatively, the response time for the source radio-frequency power supply to perform frequency tuning is less than 5 milliseconds.

BRIEF DESCRIPTION OF THE DRAWINGS

To elucidate the technical solutions of the present disclosure or the existing practices, the drawings used in describing the embodiments of the present disclosure or the existing practices will be briefly introduced below. It is apparent that the drawings as described only relate to some embodiments of the present disclosure. To those skilled in the art, other drawings may be derived based on these drawings without exercise of inventive work, wherein.

DETAILED DESCRIPTION OF EMBODIMENTS

To make the above objectives, features, and advantages of the present disclosure more apparent, the preferred embodiments of the present disclosure will be described in detail with reference to the accompanying drawings.

Many details are illustrated in the description below for sufficient understanding of the present disclosure; however, the present disclosure may also be implemented with other embodiments not described herein, and those skilled in the art may make similar extensions without departing from the scope of the present disclosure; therefore, the present disclosure is not limited to the specific embodiments described below.

Figure 7:
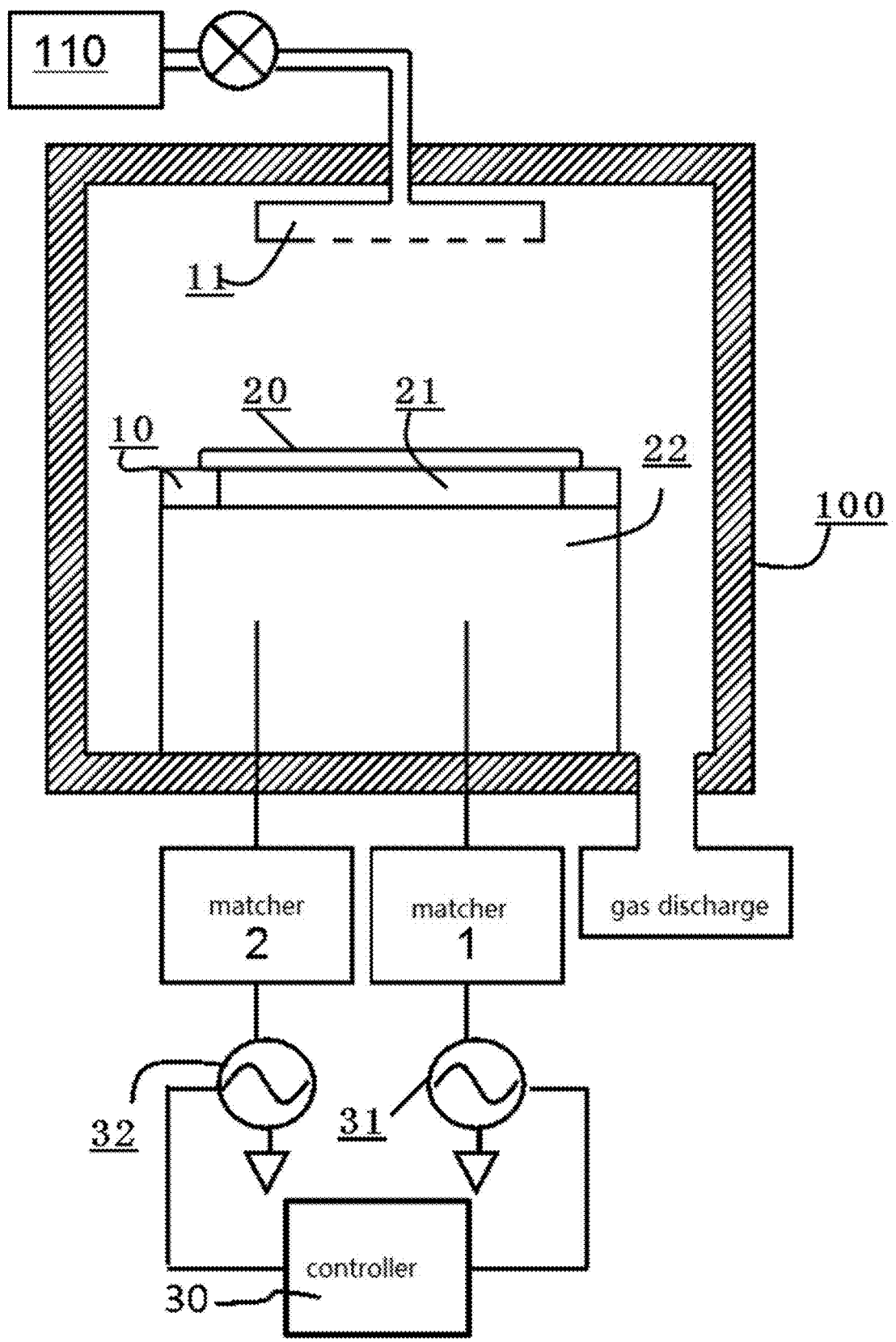
FIG. 7 is across-section structural schematic diagram of a capacitive plasma processing apparatus according to the present disclosure.

FIG. 7 shows a capacitive coupled plasma processing apparatus according to the present disclosure, the plasma processing apparatus comprising a controller 30 that is adaptable for implementing segment frequency matching, the controller 30 being configured to connect two radio-frequency power supplies 31, 32, respectively, receive output signals from the two radio-frequency power supplies, control output frequencies and output powers of the two radio-frequency power supplies, and meanwhile implement clock synchronization between the two RF signals. The controller 30 is also adapted to control various processing parameters in the plasma processing apparatus, such as gas species, flow, gas pressure, temperature of the base, etc., which will not be detailed due to being not directly related to the subject matter of the present disclosure. In existing practices, for the two radio-frequency power supplies, their power levels and power-on time can only be adjusted according to manually set parameters, which cannot leverage a variable-frequency radio-frequency power supply to realize matching with a fast varying frequency, and particularly cannot realize coordinated action between the output powers and frequencies of the two radio-frequency power supplies. With the controller, the present disclosure can implement segmented control with respect to the output frequency of the high frequency radio-frequency power supply base on the output voltage signal of the low frequency radio-frequency power supply. To facilitate understanding, the source radio-frequency power supply is hereinafter referred to as a high-frequency radio-frequency power supply, and the bias radio-frequency power supply is referred to as a low frequency radio-frequency power supply.

Figure 1:
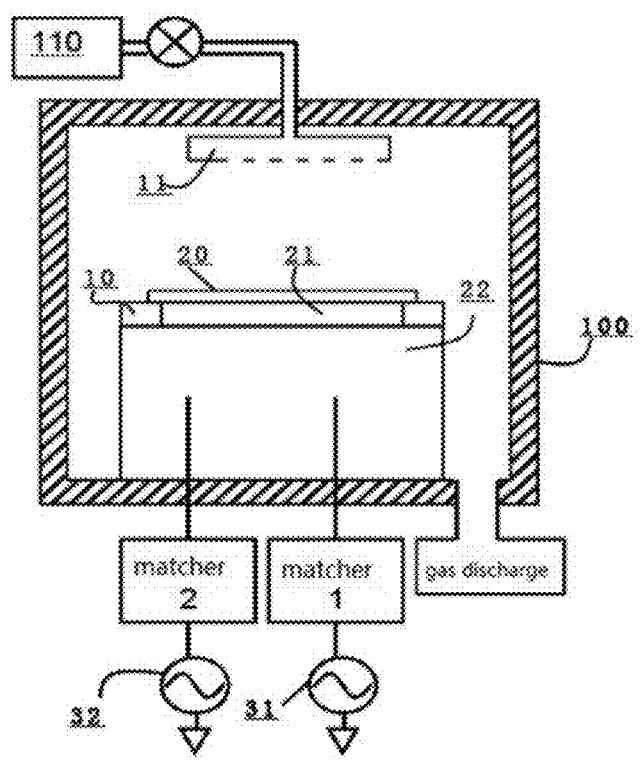
FIG. 1 is a cross-section structural schematic diagram of a capacitive coupling plasma processing apparatus in existing practices.
Figure 2:
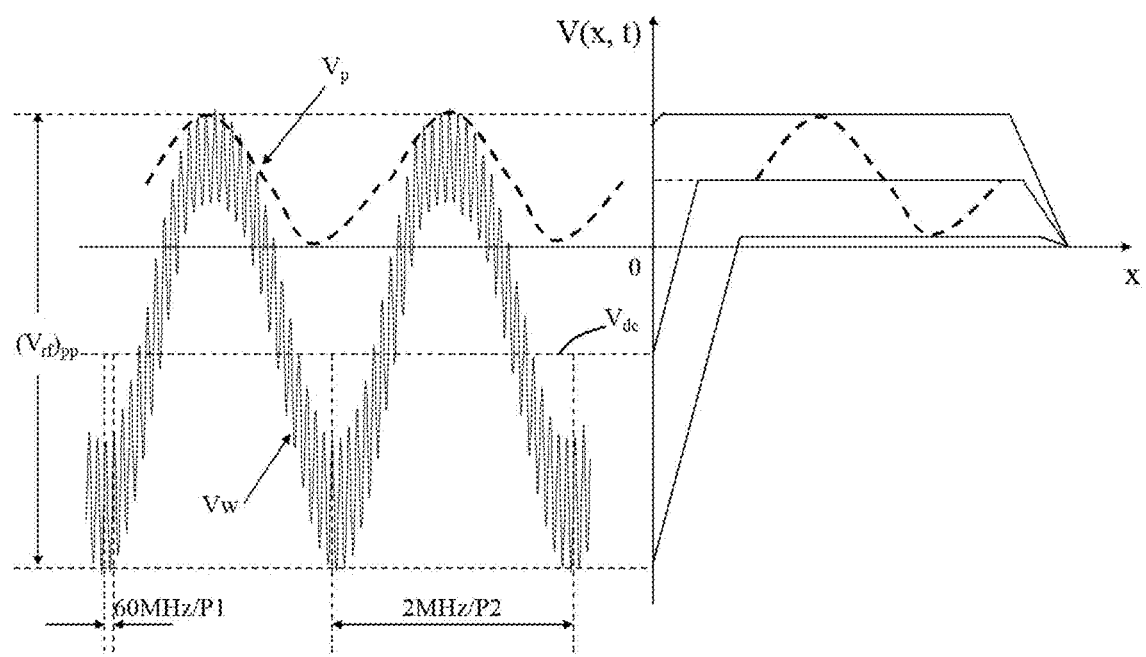
FIG. 2 is a voltage waveform schematic diagram of plasma and substrate in the capacitive coupled plasma processor.
Figure 3A:
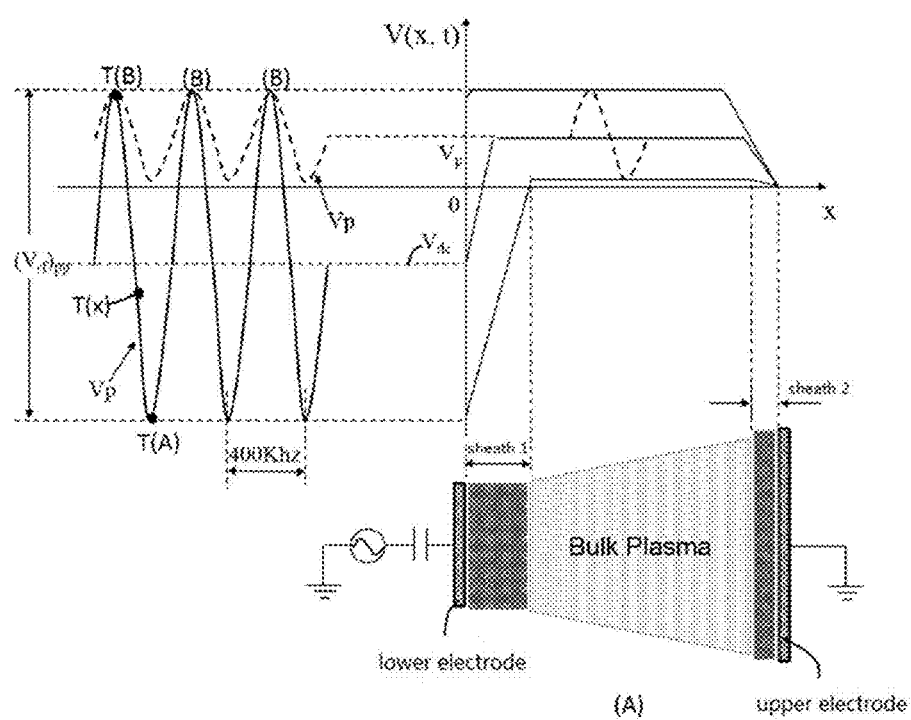
FIG. 3a is a first distribution pattern of plasma in the capacitive coupled plasma processor.
Figure 3B:
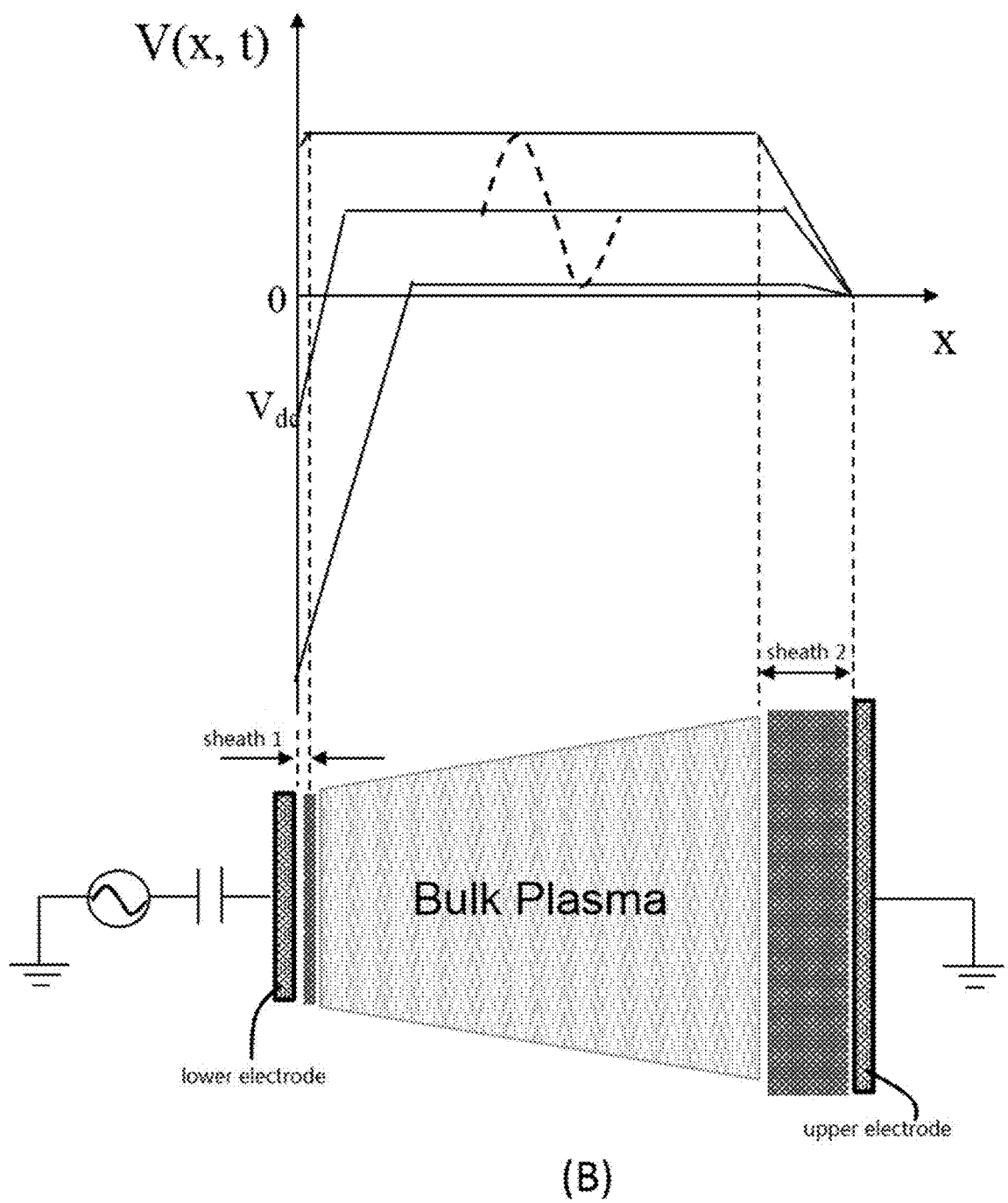
FIG. 3b is a second distribution pattern of plasma in the capacitive coupled plasma processor.

With evolution of plasma processing techniques, an ultra-low frequency bias radio-frequency power supply is required in many process recipes, wherein the frequency of the low frequency radio-frequency power outputted thereby is generally lower than 1 MHz, particularly lower than or equal to 400 KHz. With the ultra-low frequency radio-frequency power supply, the plasma impedance varies periodically with the low frequency radio-frequency output voltage. As shown in FIG. 3a, the output voltage of the low frequency radio-frequency power supply (400 KHz) varies with time, and the output voltage value periodically varies with the cycle length (2.5 μs). When the low frequency radio-frequency voltage reaches the minimal value, i.e., at T(A) time, the lower electrode has the lowest voltage, which causes the sheath 1 on the substrate surface above the lower electrode (base 22) to have a largest thickness, and the sheath 2 on the corresponding upper electrode surface (upper electrode 11 and part of the surrounding auxiliary ring) to have a smallest thickness, and then the plasm is lifted upward. As shown in FIG. 3b, the output voltage of the low frequency radio-frequency power supply reaches the maximum value, i.e., at T(B) time, when the thickness of the sheath 1 at the substrate surface becomes the minimal, while the sheath 2 on the upper electrode surface has the maximum value; then the plasma is pushed downward to the lowest position. At any moment T(X) from T(A) to T(B), the plasma varies continuously with the output voltage of the low-frequency radio-frequency power. Because the sizes of the upper and lower electrodes are different, wherein it is common that the size of the upper electrode is greater than the size of the lower electrode, the plasmas will not only move up and down, but will also vary in the distribution pattern. The continuous profile and height variations of the plasma within one 2.5 μs cycle will cause continuous change of the plasma impedance between the upper and lower electrodes. However, existing practices fail to match such fast, drastic, and continuous impedance changes. Typical mechanical devices in matchers are adopted to tune the capacitance or inductance; however, mechanical movement speed of such mechanical devices can't meet the requirement of such fast response.

The sheath thickness is determined by the amount of charges accumulated on the upper and lower electrodes when the electrons and ions in the plasma move to reach a balance between the upper and lower electrodes of the reaction chamber; as such, the thickness of the sheath is affected by the moving speed of electrons and ions; in existing practices, because the low frequency signal frequency outputted by the bias radio-frequency power source is relatively high (generally greater than or equal to 2 MHz), while acceleration time for the electronics or ions is very short under the driving of so high a frequency, before the ions are accelerated to reach the substrate, the bias voltage has already become lowered or reversed, a consequence of which is that they cannot reach the substrate surface; therefore, the thickness change of the actual sheath is very small. As the sheath thickness changes in a relatively small amplitude over one cycle, the amplitude for plasma deformation and up-down movement is also very small, so is the corresponding impedance change, such that even one optimized matching frequency can match the high frequency radio-frequency power outputs in most time of one low frequency radio-frequency power output cycle (P2). However, in applications of the present disclosure, the output frequency of the low frequency radio-frequency power supply is lower than 1 MHz, which extends the acceleration drive cycle of the bias voltage, and the sheath thickness will vary drastically; therefore, the matching method in existing practices will result in mismatch with the impedances in many intervals of one low frequency radio-frequency period P2.

Figure 4A:
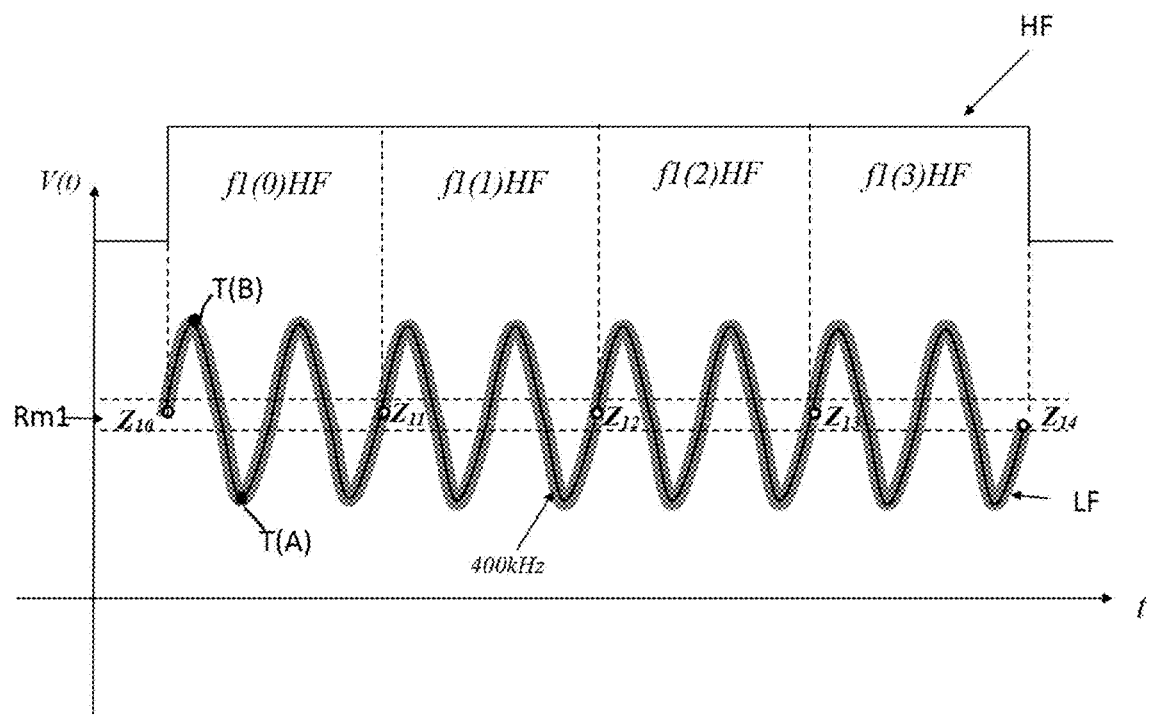
FIG. 4a is a method for obtaining a segment matching frequency in a first impedance matching segment according to the first embodiment of the present disclosure.

The present disclosure provides an embodiment to solve the above problem; as shown in FIG. 4a, the low radio-frequency frequency outputted by the low frequency radio-frequency power supply is 400 KHz, the high frequency radio-frequency power supply is pulsed at 10 KHz, and the duty cycle of a high power level pulse is 20%. Computation reveals that one high power level pulse (the high frequency radio-frequency output power level is high) includes 8 low frequency radio-frequency periods P2. In segments Rm1 within the 8 periods, as the output voltages of the low frequency radio-frequency output powers are similar, the heights and profiles of the plasma are similar, so are the impedances; therefore, it is believed that the plasma at respective intervals in the segments Rm1 has the same impedance. The present disclosure carries out automatic impedance matching by tuning the output frequency of the high frequency radio-frequency power supply; during the impedance matching process, the direction and amplitude for frequency tuning are selected based on detection of the reflected power reflected to the high frequency radio-frequency power supply 32. Besides using the reflected power, the matching state is also detectable by detecting the impedance of the plasma processor, wherein the impedance value is obtained by detecting the amplitude and phase of the radio-frequency current. The matching state refers to a state when the impedance value is lower than a predetermined threshold. The initial output frequency of the high frequency radio-frequency power supply is 60 MHz, with a tuning range from 57 MHz to 63 MHz. However, the radio-frequency power supply has a very slow response speed to automatic frequency matching; a typical radio-frequency power supply can only perform frequency tuning once at an interval of 5 μs, i.e., the frequency fine tuning can only be performed once in at least two low frequency radio-frequency periods (5 μs).

As shown in FIG. 4a, the initial frequency of the high frequency radio-frequency power corresponding to segment Rm1 is f1(0) HF, and impedance $Z_{10}$ in correspondence to this frequency is generated in the matcher 2 and the plasma; after experiencing two low frequency radio-frequency periods, the output frequency of the high frequency radio-frequency power supply is tuned to f1(1)HF, and the corresponding impedance changes to $Z_{11}$; so on and so forth, the frequency at the end of the entire high power level pulse is f1(3)HF, and the impedance turns to $Z_{14}$. The impedances $Z_{10}$-$Z_{14}$ in the 5 intervals may be identical or may not be identical; however, as the output voltages of the low frequency radio-frequency power supply in the 5 intervals are approximate, the sheath thicknesses in the plasma reaction chamber are approximate, and the profile and impedance values of the plasmas are also approximate; therefore, they may be regarded as the same impedance when performing frequency tuning so as to obtain a segment matching frequency. If the reflected power corresponding to the output frequency f1(3)HF is already very small and acceptable, it is believed that f1(3)HF is a matching frequency corresponding to segment Rm1; if the reflected power is still very large, tuning is performed again in the next high power level pulse cycle with f1(3)HF as the initial frequency, thereby obtaining the optimal matching frequency corresponding to segment Rm1.

Figure 4B:
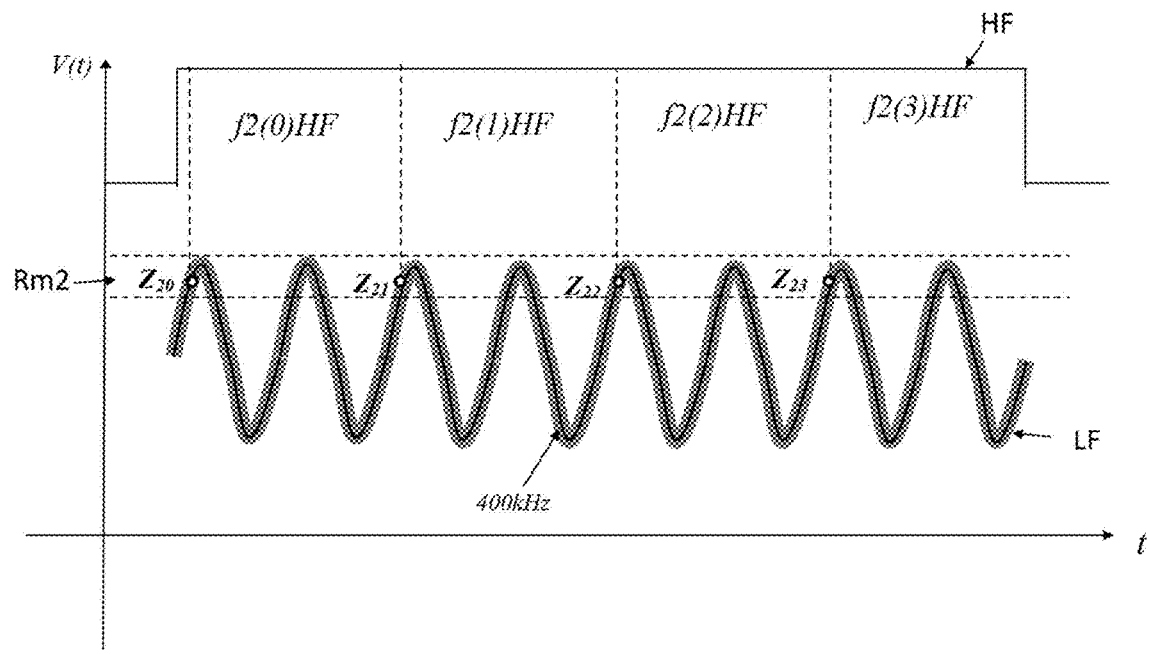
FIG. 4b is a method for obtaining a segment matching frequency in a second impedance matching segment according to the first embodiment of the present disclosure.

After obtaining the matching frequency corresponding to segment Rm1, the method proceeds to the step of obtaining the matching frequency for segment Rm2, as shown in FIG. 4b, wherein the initial frequency is f2(0)HF, and the corresponding impedance generated on the matcher 2 and the plasma is $Z_{20}$; after experiencing two low frequency radio-frequency periods, the frequency outputted by the high frequency radio-frequency power supply is f2(1)HF, when the impedance generated on the plasma is $Z_{21}$; after successive three times of tuning, frequency f2(3)HF is obtained; if the reflected power in this interval is low enough, the f2(3)HF serves as the matching frequency for segment Rm2; if the reflected power is still relatively large, frequency tuning is then performed in the next or subsequent high power periods of a plurality of pulse cycles till obtaining the matching frequency corresponding to segment Rm2.

The above steps have introduced the process and method of obtaining the matching frequencies for Rm1 and Rm2 segments; a plurality of segment matching frequencies for the high frequency radio-frequency power in other segments of one period P2 may also be obtained in a similar way, till obtaining matching frequencies covering the whole low frequency radio-frequency period.

Figure 5:
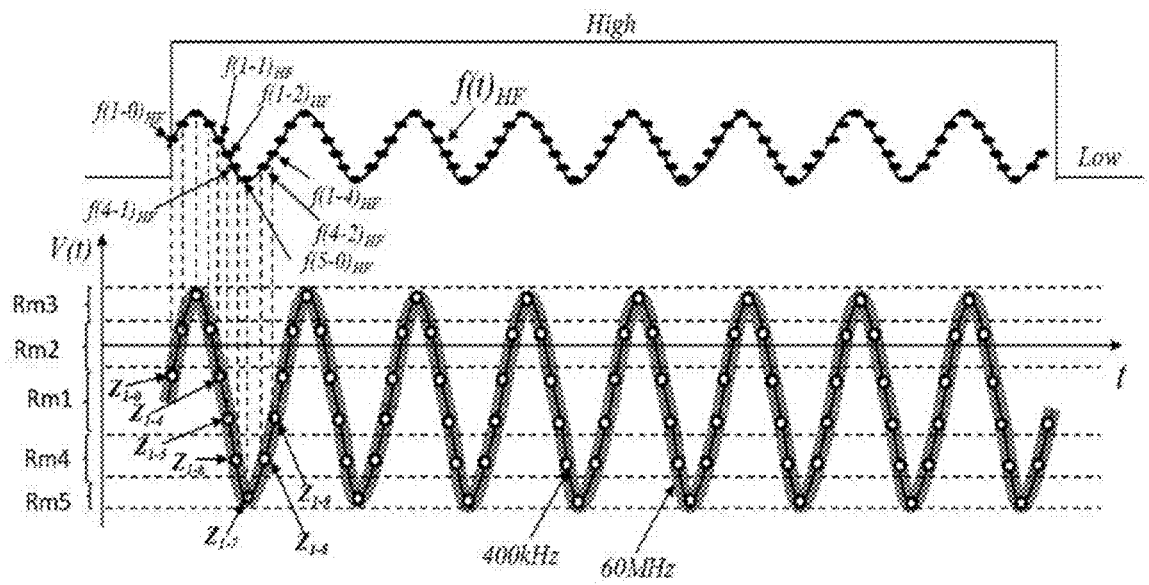
FIG. 5 is a method for obtaining multiple segment matching frequencies in one low frequency power cycle according to the second embodiment of the present disclosure.

Through hardware improvement, the high frequency radio-frequency power supply adopted by the present disclosure may reduce the response time to radio-frequency power supply tuning to be less than or equal to 0.1 μs; as such, multi-point continuous tuning is enabled within one low frequency radio-frequency period P2. As shown in FIG. 5, the response time to tuning is 0.25 μs, wherein one low frequency radio-frequency period is partitioned into 5 segments Rm1-Rm5, wherein each low frequency radio-frequency period P2 includes 10 frequency tuning points and impedances $Z_{1-0}$~$Z_{1-9}$ at the tuning points, wherein $Z_{1-0}$, $Z_{1-4}$, $Z_{1-5}$, and $Z_{1-9}$ are located in the first segment Rm1, $Z_1$-6 and $Z_{1-8}$ are located in the fourth segment Rm4, and $Z_{1-7}$ are located in the fifth segment Rm5. The high radio-frequency frequency variation curve f(t)HF above includes a plurality of frequency tuning points in one-to-one correspondence with these impedance values, wherein f(1-0)HF, f(1-1)HF, f(1-2)HF, f(1-4)HF, and f(1-5)HF correspond to $Z_{1-0}$, $Z_{1-4}$, $Z_{1-5}$, $Z_{1-9}$, and $Z_{1-10}$, respectively. Through four times of frequency tuning at the 5 points, the segment Rm1 matching frequency can be obtained in one low frequency radio-frequency period P2. Likewise, the frequencies f(4-1)HF and f(4-2)HF outputted by the high radio-frequency frequency power correspond to the impedance points $Z_{1-6}$ and $Z_{1-8}$ at segment Rm4; the tuned frequency value f(4-2) and the corresponding reflected power are stored as data and then enter segment Rm4 of the next low frequency radio-frequency period; then, frequency tuning starts again to finally obtain the matching frequency for segment Rm4. The f(5-0)HF corresponds to the impedance point $Z_{1-7}$ in segment Rm5; the second time of frequency tuning to segment Rm5 is performed at corresponding impedance points in the subsequent plurality of low frequency power periods. Therefore, in the radio-frequency power supply with a very short response time to radio-frequency power supply frequency tuning, the matching frequencies for segments Rm1~5 can be obtained in a very few low frequency radio-frequency periods P2, which significantly reduces waste of radio-frequency power and overheat of electrical components caused by frequency mismatch in the previous matching frequency obtaining step. The actual waveform of the frequency variation curve f(t)HF is not limited to the sinusoid shown in the figure, which can be other wave forms, as long as such waves can gradually reduce the reflected power through frequency tuning; any matching-enabled frequency variation waveform is an implementation of the present disclosure.

Figure 6:
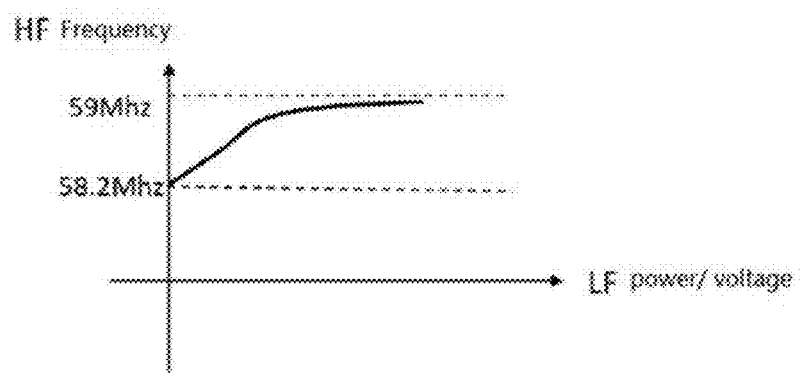
FIG. 6 is a curve graph for low frequency radio-frequency powers and high frequency matching frequencies.

The present disclosure further provides a third kind of segment matching frequency obtaining method so as to reduce the tuning time of the matching frequency obtaining step and further reduce the reflected power. In various plasma processing chambers and processing techniques, the matching frequency for each segment will vary periodically with the output voltage of the low frequency radio-frequency power, such that an accurate matching frequency corresponding to each segment cannot be directly obtained; despite of that, the distribution of their matching frequencies still has a common rule, e.g., FIG. 6 shows a distribution variation rule curve in which the matching frequency varies with the low frequency radio-frequency power/voltage. This curve is affected by plasma processing parameters (gas pressure, compositions, radio-frequency power) and the reaction chamber hardware feature (the sizes of upper and lower electrodes, the size of the reaction chamber), etc. It is seen from the figure that the plasma impedance change caused by periodic change of the sheath thickness can be compensated for by the frequency varying in a relatively small range (0.8 KHz); moreover, the sheath thickness change and the low frequency radio-frequency power does not develop linearly; instead, the sheath thickness increases gradually with increase of the low frequency radio-frequency power; therefore, the segment with the maximum change rate in the entire frequency tuning scope is positioned in the region with relatively low frequency low input power/voltage. Based on the above discovery, the present disclosure proposes a method of obtaining complete matching frequency data corresponding to all segments by inputting the matching frequencies (e.g., the matching frequency in Rm1) corresponding to one or a few impedance matching segments, which are obtained using the method described in the first or second embodiment, as well as other processing parameters, into the controller, and then performing curve fitting computation. The segment Rm1 is the segment with the lowest radio-frequency power output; therefore, with a few accurate data regarding the segments with the drastic sheath thickness variation, all data in the entire period can be obtained based on curve fitting. In order to obtain more accurate curve fitting data, the matching frequency for an additional segment (e.g., segment Rm4) may be obtained using the matching frequency learn obtaining method disclosed in the first embodiment or the second embodiment; as such, with the inputs of the matching frequencies for two segments, more accurate matching frequency data for other segments can be obtained through computation. Such curve fitting may significantly reduce the execution time of the matching frequency obtaining step, such that accurate matching frequencies of all segments may be obtained by partially frequency tuning and partially computing in a few preceding low frequency radio-frequency periods.

The matching frequency obtaining step needs to be performed not only at the high power level pulse stage of the high radio-frequency frequency (HF) power output but also at the low power level pulse stage of the high radio-frequency frequency power output; the steps are identical to those described in the first and second embodiments; it is needed to partition one low radio-frequency frequency output period P2 into a plurality of segments, such that tuning is performed once or for multiple times to the output frequency of the high frequency radio-frequency power supply in each segment so as to obtain corresponding reflected power data. Then, the segment matching frequencies corresponding to respective segments are obtained one-by-one in a plurality of low radio-frequency frequency output periods P2.

After obtaining a plurality of segment matching frequencies through the matching frequency obtaining step described above, the method proceeds to the subsequent variable frequency matching step, in which with variation of the output voltage of the low frequency radio-frequency power, the frequency outputted by the high frequency radio-frequency power supply is automatically switched to the corresponding segment matching frequency. As shown in FIG. 5, the matching frequencies outputted by the high frequency radio-frequency power supply sequentially correspond to the pre-obtained segment matching frequencies of corresponding segments Rm1-Rm2-Rm3-Rm2-Rm1-Rm4-Rm5-Rm4. In this way, the power outputted by the high frequency radio-frequency power supply can completely match the impedance of the downstream matching circuit and plasma, not affected by the variation of low frequency radio-frequency power output voltage. As the output frequency value is learned for the high frequency radio-frequency power supply, it's unnecessary to detect and compute the reflected power, such that the frequency tuning speed of existing radio-frequency power supplies suffices to perform enough times of frequency tuning within one low frequency radio-frequency period P2, which may implement good impedance matching for all segments.

Besides partitioning each low radio-frequency frequency output period into 5 segments, as shown in FIG. 5, it may also be partitioned into 3 segments to the minimal according to the present disclosure, except that in the latter case, the impedance variation amplitude in each segment is relatively large, such that one corresponding segment matching frequency cannot accurately match the impedances at all moments in the segment and the reflected power is also relatively large; however, compared with existing practices in which there are only one fixed frequency in the entire low frequency radio-frequency power cycle (P2), this solution can significantly reduce the reflected power, the 3-segment partition solution also belongs to one of the embodiments of the present disclosure. Or, each low radio-frequency frequency output power may be optimally partitioned into more segments, e.g., 7 segments or 9 segments, as long as the RF reflected amount in the preceding matching frequency obtaining step can accept, any number of segments is available, which all belong to embodiments of the present disclosure.

Besides being applied to the capacitive coupling (CCP) plasma processor, the present disclosure may also be applied to an inductively coupled (ICP) plasma processor. The inductive coupled plasma processor also comprises a lower electrode, wherein the lid and sidewall(s) of the reaction chamber are all made of conductors and electrically grounded, which may be regarded as an upper electrode, except that the area of the upper electrode is shorter than that of the lower electrode; therefore, there still exists a situation that the upper electrode area is not equal to the lower electrode area; therefore, during the plasma process the thickness changing sheath on the upper and lower electrodes still cause deformation of the plasma. Therefore, the matching frequency obtaining step provided by the present disclosure is still applicable to impedance matching for the inductive coupled plasma processor so as to obtain segment matching frequencies; then, variable frequency multi-segment matching is performed; when the low radio-frequency frequency is extremely low, the reflected power of the high radio-frequency power is minimized.

Besides being applied to the process of pulsed radio-frequency power output, the present disclosure may also be applied to a continuous RF processing, i.e., maintaining a long-term stable output of the high radio-frequency frequency power. In the continuous RF processing, as long as the output frequency of the low frequency radio-frequency power is low enough (less than 1 MHz), it will cause drastic change of the sheath thickness of the upper and lower electrodes, and the plasma impedance will also vary drastically; therefore, it is also needed to perform segment matching during the high radio-frequency frequency power output process so as to realize a better impedance matching.

It is discovered that when the low radio-frequency frequency is lower than 1 MHz, the plasma impedance varies synchronously with the output voltage of the low frequency radio-frequency power supply; then, the present disclosure provides a novel segment frequency matching method, comprising a segment frequency matching obtaining/learning step. The segment frequency matching obtaining step includes: partitioning a low frequency radio-frequency power output period into a plurality of segments; and in each segment, tuning the output frequency of the high radio-frequency frequency source, detecting the reflected power of the high radio-frequency frequency source, and after experiencing one or more low frequency radio-frequency power output periods, obtaining and storing the segment matching frequency for each segment. The segment frequency matching method further comprises a subsequent variable-frequency matching step, including: setting the output frequency of the high frequency radio-frequency power supply to vary periodically at the stored segment matching frequencies so as to match characteristic impedances in respective segments. In plasma processing, it often occurs to switch between different processing steps; therefore, various parameters in the plasma processing chamber will also vary frequently, which will cause change to plasma impedance. By adopting the matching method provided by the present disclosure, in the first plasma processing step, the various segment matching frequencies obtained in one segment matching frequency step are not surely applicable in the subsequent second plasma processing step; therefore, it is needed to continuously monitor the reflected power of the high frequency radio-frequency power supply; once it is found that the reflected power is greater than a threshold, e.g., the reflected power reaches 10% of the output power of the radio-frequency power supply, the segment matching frequency obtaining step will be initiated again to obtain a new batch of segment matching frequencies so as to achieve good matching during the entire plasma processing process.

Besides the segment matching frequency obtaining step disclosed in the embodiments above, it is alternative in the present disclosure not to execute the frequency self-learning step in each plasma processor, which can still obtain the matching frequencies for respective segments by tuning the high radio-frequency frequency in one or more low frequency radio-frequency periods. In this alternative embodiment, a plasma processor for testing or processing verification purpose may be provided so as to obtain the optimal processing parameters. also learn and store the segment matching frequencies for the plurality of segments during the adjustment and verification process, and later in the formal and batch plasma processing, a large number of plasma processors may achieve the invention purpose by downloading the stored segment matching frequency data from the verification-purpose plasma processor. In this case, such batch-processing plasma processors need not perform the matching frequency obtaining step, which also belongs to one of the alternative embodiments of the present disclosure. For the batch-processing plasma processors, the controller 30 therein is only provided with a storage unit, the storage unit being configured for storing a plurality of segment matching frequencies downloaded from other devices or databases. The controller further comprises a determining module, the determining module being configured to determine the current segment e based on the detected low frequency radio-frequency power periodic signal, and output, based on segment selection, a corresponding segment matching frequency to the high frequency radio-frequency power supply, such that the high frequency radio-frequency power supply outputs an appropriate segment matching frequency matched with the impedance of the plasma processor in current segment. For the verification-purpose plasma processor, the processing storage unit is further provided with a computing unit which tunes up the segment matching frequency of each segment in the learning step based on a preset program so as to gradually approach the optimal segment matching frequency based on the magnitude of the reflected power. The obtained plurality of segment matching frequencies are stored in the memory, and the segment matching frequency data are directly uploaded to the high frequency radio-frequency power supply utilized in the subsequent plasma processing such that the high frequency radio-frequency power supply directly outputs the optimal matching frequency in a plurality of segments.

Through long-term plasma processing, a large amount of plasma processing parameters and corresponding segment matching frequencies are obtained; these plasma processing parameters and segment matching frequencies may be subject to big data processing using one or more computers so as to analyze the influence factors of various processing parameters on respective segment matching frequencies. For example, the gas compositions and flows have a highest influence on the matching frequencies, then the radio-frequency power and gas pressure have a second highest influence; while the temperatures of the internal components inside the reaction chamber have less influence; the influence degree and direction (positive/negative) of these parameters over the matching frequencies may be obtained through big data analysis. Meanwhile, the hardware settings and materials inside the plasma processor are also influential factors, such as inter-electrode spacing, electrode material, surface coating, part sizes, etc. With the collected big data, the segment matching frequencies for a new processing process may be automatically worked out based on plasma processing parameters and hardware parameters without repetitively obtaining the matching frequencies. Therefore, it is only needed to install corresponding data analysis software in the plasma processor or connect the plasma processor to an external database, and then the corresponding plurality of segment matching frequencies can be directly downloaded or worked out without performing the matching frequency obtaining step.

In the present disclosure, besides outputting respective segment matching frequencies in the plurality of segments, the segment matching frequencies may be outputted for some segments of the plurality of impedance matching segments, while the output frequencies for other segments are not required to be optimal segment matching frequencies. For example, the low frequency radio-frequency period includes 5 segments, i.e., segments 1 to 5, wherein designated segment matching frequencies are outputted in segments 1, 2 and 4, while the output frequencies of the immediately preceding segments are followed in segments 3 and 5, i.e., without frequency change. Although such an embodiment has a degraded matching level compared with the preceding multiple embodiments, it is still better than the method of low frequency radio-frequency power outputting a fixed matching frequency in existing practices, and it can still significantly reduce the RF reflected power.

What have been described above are only preferred embodiments of the present disclosure; despite of those preferred embodiments disclosed above, the present disclosure is not limited thereto. Any technical person familiar with this field may make various possible alterations and modifications to the technical solutions of the present disclosure or modify them into equivalent varied embodiments using the methods and technical contents described above without departing from the scope of the technical solutions of the present disclosure. Therefore, any content without departing from the technical solutions of the present disclosure and any simple alteration, equivalent change and modification to those embodiments based on the technical substance of the present disclosure still fall within the protection scope of the technical solutions of the present disclosure.

We claim:
1. A plasma processor, comprising:
   a reaction chamber, in the reaction chamber being provided a base, the base being used to hold a wafer;
   a source radio-frequency power supply, configured for applying a first radio-frequency periodic signal into the reaction chamber so as to ignite and maintain plasma, the source radio-frequency power supply being a fre- quency-tuning power supply, the frequency of the first radio-frequency periodic signal being tunable within a preset range;

a bias radio-frequency power supply, configured for applying a second radio-frequency periodic signal to the base, each cycle of the second radio-frequency periodic signal including a plurality of impedance matching segments, output voltage of the bias radio-frequency power supply varying between the plurality of impedance matching segments;

and a controller configured for controlling the source radio-frequency power supply to selectively output a segment matching frequency during each impedance matching segment so as to guarantee that radio-frequency power outputted by the source radio-frequency power supply can be effectively applied into the reaction chamber to thereby reduce reflected power.

2. The plasma processor according to claim 1, wherein the controller comprises a storage unit that stores segment matching frequencies in one-to-one correspondence with the plurality of impedance matching segments, during one of the impedance matching segments, the controller controlling the source radio-frequency power supply to output the matching frequency corresponding to the impedance matching segment.

3. The plasma processor according to claim 2, wherein the controller performs frequency tuning for the source radio-frequency power supply at least once during each impedance matching segment to obtain a segment matching frequency, and stores the segment matching frequency and its corresponding impedance matching segment in the storage unit.

4. The plasma processor according to claim 3, wherein a segment matching frequency learning program is provided in the controller, the segment matching frequency learning program including: tuning output frequency of the first radio-frequency periodic signal at least once during each impedance matching segment, detecting a reflected power value or plasma processor impedance value which corresponds to each output frequency, wherein when the reflected power value or plasma processor impedance value is lower than a predetermined threshold, the output frequency is determined as the segment matching frequency for the impedance matching segment.

5. The plasma processor according to claim 4, wherein the controller has a database that stores bias radio-frequency power supply output voltages and corresponding matching frequencies, and the controller performs the segment matching frequency learning program to obtain a learned segment matching frequency corresponding to the impedance matching segment, and then calculates based on the learned segment matching frequency and the database to obtain other plurality of segment matching frequencies.

6. The plasma processor according to claim 1, wherein the controller comprises a computing unit that calculates based on input processing parameters to obtain a plurality of segment matching frequencies matched with the processing parameters, and the controller controls the source radio-frequency power supply to output a matched segment matching frequency during each impedance matching segment.

7. The plasma processor according to claim 1, wherein the frequency of the first radio-frequency periodic signal is greater than 10 MHz, and the frequency of the second radio-frequency periodic signal is lower than 1 MHz.

8. The plasma processor according to claim 1, wherein the frequency of the second radio-frequency periodic signal is lower than 500 KHz.

9. The plasma processor according to claim 1, wherein the second radio-frequency period includes at least 3 impedance matching segments, output voltage of the bias radio-frequency power supply varies alternately and periodically between the highest voltage and the lowest voltage, the average voltages during the first through the $N^{th}$ impedance matching segments are sequentially arranged from low to high, and the plurality of segment matching frequencies are respectively matched with the impedances of the plasma during the first through the $N^{th}$ impedance matching segments.

10. The plasma processor according to claim 9, wherein response time for the source radio-frequency power supply to perform frequency tuning is set to be greater than or equal to period length of the second radio-frequency periodic signal, wherein a first segment matching frequency corresponding to the first impedance matching segment is learned in the first impedance matching segment across multiple second radio-frequency periods, and a second segment matching frequency corresponding to a second impedance matching segment is learned, in the second impedance matching segment across the subsequent plurality of second RF periods.

11. The plasma processor according to claim 9, wherein the response time for the source radio-frequency power supply to perform frequency tuning is shorter than the period length of the second radio-frequency periodic signal, the source radio-frequency power supply performs frequency matching in the first and second impedance matching segment of one second RF period.

12. The plasma processor according to claim 4, wherein the output power of the source radio-frequency power supply is pulsed, and varies alternately between the high power level and the low power level, wherein the pulse frequency spans from 100 KHz to 10 KHz.

13. The plasma processor according to claim 12, wherein when the output power of the source radio-frequency power supply is in a high power level, the segment matching frequency learning program is performed once to obtain and store the segment matching frequencies corresponding to the high power level; and when the output power of the source radio-frequency power supply is in a low power level, the segment matching frequency learning program is performed once again to obtain and store the segment matching frequencies corresponding to the low power level.

14. The plasma processor according to claim 1, wherein the frequency of the first radio-frequency periodic signal is f0, and the frequency variable range of the first radio-frequency periodic signal is f0±5%.

15. The plasma processor according to claim 1, wherein the controller further comprises a determining module that determines the currently located impedance matching segment based on the second radio-frequency periodic signal and controls the source radio-frequency power supply to selectively output the segment matching frequency for the determined impedance matching segment.

16. A frequency-tuning matching method for a plasma processor, comprising:
providing a source radio-frequency power supply that outputs a first radio-frequency periodic signal into the plasma processor so as to ignite and maintain the plasma, the source radio-frequency power supply being a frequency-tuning power supply, the frequency of the first radio-frequency periodic signal being tunable within a preset range;
providing a bias radio-frequency power supply that outputs a second radio-frequency periodic signal to a base in the plasma processor, wherein each cycle of the second radio-frequency periodic signal includes a plurality of impedance matching segments, wherein average output voltage of the bias radio-frequency power supply varies between the plurality of impedance matching segments;

and providing a controller that controls the source radio-frequency power supply to output a segment matching frequency at each impedance matching segment such that the radio-frequency power outputted by the source radio-frequency power supply can be effectively applied into the plasma processor to thereby reduce reflected power.

17. The method according to claim 16, further comprising: a segment matching frequency learning step, the segment matching learning step including: tuning output frequency of the first radio-frequency periodic signal at least once during each impedance matching segment of the second RF period, and detecting a reflected power value or plasma processor impedance value which corresponds to each output frequency, wherein when the reflected power value or plasma processor impedance value is lower than a predetermined threshold, the output frequency is determined as the segment matching frequency of the impedance matching segment.

18. The method according to claim 17, wherein the controller has a database that stores bias radio-frequency power supply output voltages and corresponding matching frequencies, performs the segment matching frequency learning step at least once to obtain a segment matching frequency corresponding to at least one impedance matching segment, and calculates based on the segment matching frequency obtained and the database to obtain the other segment matching frequencies.

19. The method according to claim 16, wherein the controller calculates based on inputted processing parameters to obtain a plurality of segment matching frequencies matched with the processing parameters, and the controller controls the source radio-frequency power supply to output a matched segment matching frequency during each impedance matching segment.

20. The method according to claim 17, wherein a storage unit is provided in the controller, and the segment matching frequencies and the corresponding impedance matching segments are stored in the storage unit.

21. The method according to claim 16, wherein a determining module is provided in the controller, wherein the determining module is configured to determine the currently located impedance matching segment based on the second radio-frequency periodic signal, and the controller controls the source radio-frequency power supply to selectively output the segment matching frequency corresponding to the determined impedance matching segment.

22. The method according to claim 16, wherein in the plasma processing process, the reflected power value or plasma processor impedance value corresponding to the output frequency of the source radio-frequency power supply is continuously monitored, and when the reflected power value or plasma processor impedance value is greater than a preset threshold, the matching frequency learning step is performed once again.

23. The method according to claim 16, wherein each second radio-frequency periodic signal cycle includes more than 3 impedance matching segments, the output voltage of the bias radio-frequency power supply is set to vary alternately and periodically between the lowest voltage and the highest voltage, the average voltages during the first through the $N^{th}$ impedance matching segments are sequentially arranged from low to high, and the plurality of segment matching frequencies are respectively matched with the impedances of the plasma during the first through the $N^{th}$ impedance matching segments.

24. The method according to claim 16, wherein output power of the source radio-frequency power supply is pulsed; and the source radio-frequency power supply varies alternately between the high power level and the low power level, wherein the pulse frequency ranges from 100 KHz to 10 KHz.

25. The method according to claim 24, wherein when the output power of the source radio-frequency power supply is in a high power level, the segment matching frequency learning program is performed once to obtain and store the segment matching frequencies during high power level; and when the output power of the source radio-frequency power supply is in a low power level, the segment matching frequency learning program is performed once again to obtain and store the segment matching frequencies during low power output level.

26. A radio-frequency power supply system, comprising:
a source radio-frequency power supply, configured for outputting a first radio-frequency periodic signal, the source radio-frequency power supply being a frequency tuning power supply, the frequency of the first radio-frequency periodic signal being tunable within a preset range;
a bias radio-frequency power supply, configured for outputting a second radio-frequency periodic signal, each cycle of the second radio-frequency periodic signal including a plurality of impedance matching segments, output voltage of the bias radio-frequency power supply varying between the plurality of impedance matching segments;
and a controller, configured for controlling the source radio-frequency power supply to selectively output a segment matching frequency during each impedance matching segment.

27. The radio frequency power supply system according to claim 26, wherein the controller comprises a storage unit that stores segment matching frequencies in one-to-one correspondence with the plurality of impedance matching segments, the controller controlling the source radio-frequency power supply to output the radio-frequency power at the segment matching frequency during a corresponding impedance matching segment.

28. The radio frequency power supply system according to claim 27, wherein the response time for the source radio-frequency power supply to perform frequency tuning is less than 5 milliseconds.

* * * * *